DIFFUSION BONDER

Filed May 24, 1963

INVENTOR.
CLYDE L. ZACHRY
JACK B. NORTHRUP
WILLIAM R. CANN
BY Sidney Magnes
AGENT INVENTORS
CLYDE L. ZACHRY
JACK B. NORTHRUP
WILLIAM R. CANN
BY
Sidney Magnes
AGENT May 16, 1967 C. L. ZACHRY ET AL 3,320,401

DIFFUSION BONDER

Filed May 24, 1963 4 Sheets-Sheet 3

INVENTORS
CLYDE L. ZACHRY
JACK B. NORTHRUP
WILLIAM R. CANN
BY
Sidney Magnes
AGENT

DIFFUSION BONDER

Filed May 24, 1963

INVENTORS
CLYDE L. ZACHRY
JACK B. NORTHRUP
WILLIAM R. CANN
BY
Sidney Magnes
AGENT 3,320,401
DIFFUSION BONDER
Clyde L. Zachry, Norco, and Jack B. Northrup and William R. Cann, Anaheim, Calif., assignors to North American Aviation, Inc.
Filed May 24, 1963, Ser. No. 282,904
10 Claims. (Cl. 219—119)

This invention relates to the bonding together of two materials; and more particularly to diffusion bonding, wherein the atoms of one material diffuse into the second material, while the atoms of the second material diffuse into the first material.

*Background*

It is frequently necessary to bond together two materials; and a peculiar type of bonding is essential in the electronics industry. Here wires must conduct electricity to various electronic components such as resistors, capacitors, transistors, diodes, transformers, etc.; and it is essential that the bond between the wire and the component have good electrical conductivity, high mechanical strength, and the ability to withstand rough handling, vibration, hostile atmospheres, etc.

A recent electronic development uses a so-called "printed-wire board" that comprises a substrate onto which is affixed a pattern of conductive strips that resemble and act as wires. Various electrical components "jumper" wires are bonded to portions of the printed wire pattern to form a unitary structure; and other "lead" wires interconnect various printed-wire boards and external circuitry to lead the electricity to the structure.

Efforts to lighten the electronic circuitry resulted in extremely small, or "microminiaturized," printed-wire boards and electronic components; and introduced the problem of miniaturizing the bonding, since the microminiaturized structure had only limited room for the bonding tools and bonds themselves.

A review of prior art bonding techniques will be helpful in the appreciation of the subject invention.

One such bonding method, known as "brazing," causes a secondary material—such as solder—to be placed between the two primary materials to be bonded. The assembly is then heated to a temperature that causes the solder to melt, and to wet the surfaces of the two primary materials. The three materials are then pressed together and permitted to cool; whereupon the solder solidifies, and acts as an electrically-conductive cement that bonds together the two primary materials.

The above soldering process is widely used in the electronic art; but suffers several disadvantages when used in microminiaturized circuitry. First of all, the soldering tools are hot and relatively large; and they tend to burn adjacent wires and components. Secondly, the relatively high temperature may cause the printed-wire pattern to become detached from the substrate. Thirdly, many of the electronic components—particularly the miniaturized forms thereof—are easily ruined by the high temperatures required to melt the solder.

The use of molten solder has another disadvantage in microminiaturized circuitry; this additional disadvantage stemming from the fact that the wires are usually extremely fine, being as small as .0005 inch in diameter, which is finer than a human hair. When the end of the wire is exposed to the hot molten solder, some of the wire material is dissolved by the molten solder, thus reducing the diameter of the wire at the point where it becomes soldered. This so-called "necking down" of the wire increases the electrical resistance at that point, which may be detrimental to the operation of the circuit; or even worse, the necking-down may thin the wire to such an extent as to introduce a point of weakness at which the wire may break.

Another method of bonding together two materials is that known as welding.

One widely used welding technique, known as "resistance" welding, causes the two materials to be pressed together, and directs a fairly heavy electric current through the "interface" formed at the junction of the two materials. Since the interface is an area of relatively high electrical resistance, the electric current produces a great deal of localized heat at that area. This heat melts the two materials at their interface; the molten materials fusing, and then solidifying to form a bond between the two different materials.

When used with microminiaturized electronic circuitry the high temperature produced at the interface has the same disadvantage as previously discussed, namely that it endangers the wires and the printed-wire pattern.

A third method of bonding is known as "diffusion" bonding.

In this process the materials are also pressed together to form an interface between their surfaces. The interface is then heated to a diffusion temperature that is well below the melting point of any of the materials; but is high enough to permit the atoms of one material to diffuse into the other material—while the atoms of the second material simultaneously diffuse into the first.

In the past the diffusion process was achieved by heating the entire substrate, and the printed-wire pattern on it, to a temperature that was suitable for the diffusion process to take place. The substrate, the printed-wire pattern, and the electronic components associated therewith, were then held at this temperature while several wires were diffusion-bonded to particular portions of the printed wire pattern.

This procedure suffered from the fact that the entire assembly is held at that temperature for an appreciable interval of time. Even though the assembly is not heated to as high a temperature as in the welding process, the sustained heating tends to endanger the microminiaturized components and the printed wire pattern. Because of their different coefficients of expansion, a strain occurs between the substrate and the printed wiring pattern, and frequently causes the printed wire pattern to peel away from the substrate.

It is therefore the principal object of the invention to provide an improved method and apparatus for diffusion bonding.

The attainment of this object and others will be realized from the following specification, taken in conjunction with the drawings, of which FIGURE 1 shows the basic inventive concept;

FIGURES 3–10 show other arrangements for practicing the invention.

*Synopsis*

The present invention contemplates a diffusion bonder wherein only the bonding area is heated; this local heating being only to the necessary diffusion temperature; and being sustained for only the length of time required to complete the single bonding process at that bonding area—without raising the temperature of any of the electronic components, any other part of the substrate or the printed wiring pattern, or endangering any of the lead wires.

The present invention contemplates electrodes for diffusion-bonding "lap" joints and "nail-head" joints; and in addition, control and testing circuitry for achieving these results are also disclosed.

*Description of the invention*

Figure 1:
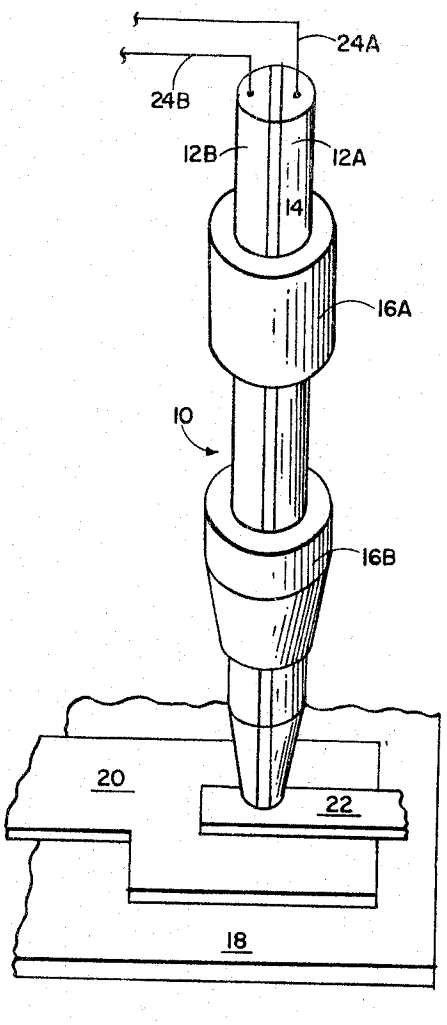

A split electrode and the method of using it are shown in FIGURE 1.

Here the split electrode 10 comprises a three-piece rod; the two outer portions 12 comprising electrically-conductive material such as copper, while the center portion 14 is an insulator such as Teflon, mica, or one of the well-known epoxys. Retaining collars 16, formed of suitable material such as Teflon, hold the three portions of the electrode to form a unitary split-electrode structure. The lower collar 16B may be tapered in order to permit better visibility and positioning of the electrode. Alternatively, if desired, the structure may be held together by a suitable adhesive.

As previously explained, it is desired to bond a wire to a portion of a printed-wire pattern, or to another conductive element. While the wire may be a jumper wire, the termination wire on an electronic component, or a lead wire, the term lead wire will be used for convenience.

FIGURE 1 shows a substrate 18 upon which is formed a printed-wire pattern; a portion of this pattern being indicated by reference character 20.

A lead wire 22 is to be electrically connected to printed wire pattern 20; the illustration showing lead wire 22 as comprising a ribbon of conductive material, such as gold; while the conductive printed-wire pattern 20 may comprise any conductive material such as aluminum, silver, gold, platinum, or the like. The illustration shows lead wire 22 positioned on a so-called "mesa" or "pad" portion of printed wire pattern 20 in an overlapping relation to make a so-called "lap" bond.

The diffusion bond is produced as follows. Electricity of suitable voltage and current is supplied by electrode wires 24, the current traveling down one outer portion 12, through the lead wire 22 positioned below the end of electrode 10, and up through the other outer portion 12 to complete the electrical circuit.

It will be seen that a small area of lead wire 22 is part of the electrical circuit. In accordance with well known principles, the electric current passing through this area of lead wire 22 causes the lead wire to become warm; and the heat is conducted to the contiguous portion of printed wire pattern 20. The diffusion bonding area, i.e., the interface formed by the contiguous lower surface of lead wire 22 and the upper surface of printed wire pattern 20 is thus warmed to the diffusion temperature; whereby diffusion takes place.

As previously explained, in diffusion bonding atoms of the lead wire 22 diffuse into the material of printed pattern 20; and simultaneously atoms of the printed-wire material diffuse into the lead wire 22. An interval as short as one-tenth of a second is sufficient to provide a diffusion bond that is as strong as the bond between the printed wire pattern 20 and the substrate 18.

In structural testing of microminiaturized circuitry bonded by the above described technique, structural failure generally occurred at the wire itself, or between the substrate 18 and the printed wire pattern 20; very rarely did failure occur at the diffusion bond between lead wire 22 and printed wire pattern 20.

It will be understood that the invention provides a short-duration localized heating of the diffusion bonding area, leaving the rest of the printed wire pattern and the substrate at their ambient temperature. This particular approach does not overheat any portion of the assembly; and therefore practically eliminates peeling of the printed wire pattern from the substrate.

Figure 2:
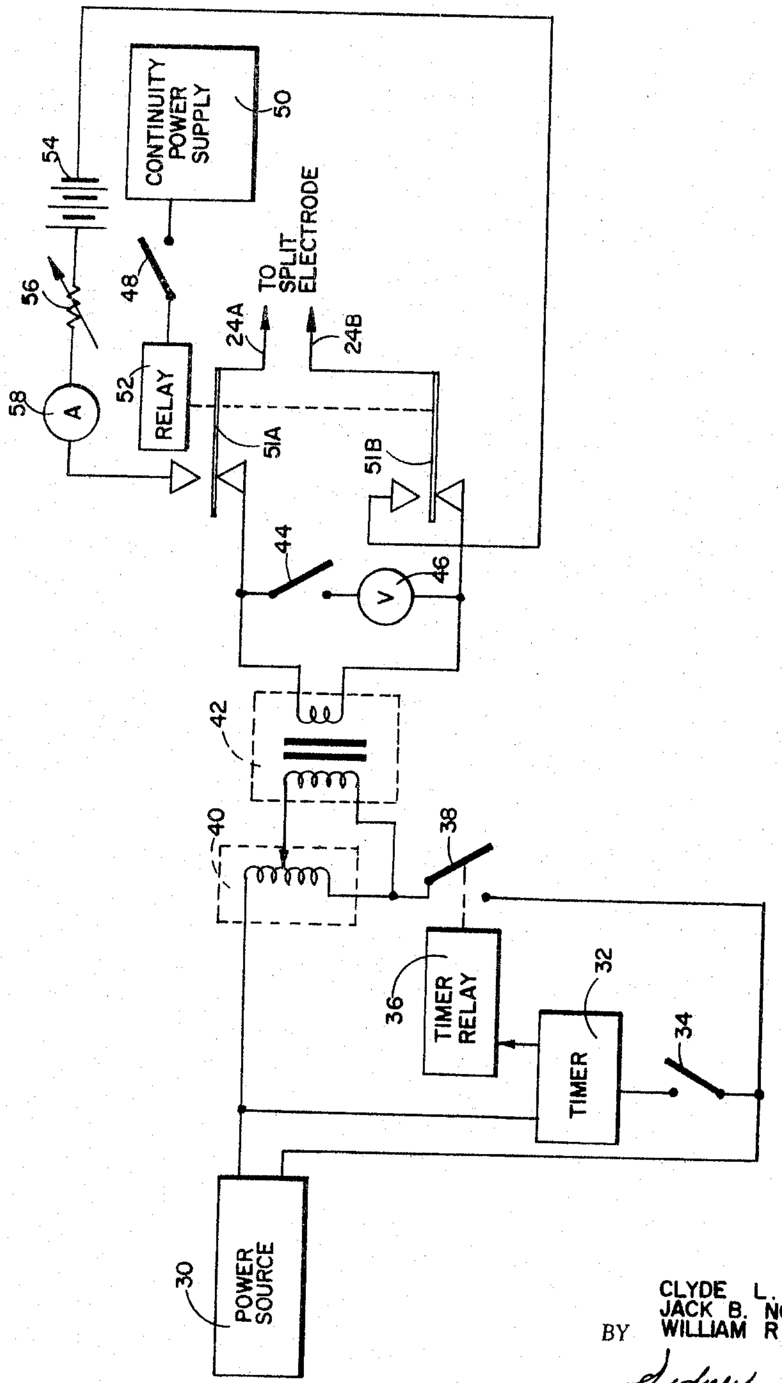
FIGURE 2 shows exemplary control circuitry.

While any suitable control circuit may be used, FIGURE 2 shows a relatively simple circuit for controlling the diffusion bonding.

A power source 30, which may be the usual A.C. line, has a timer 32 and a timer switch 34 connected in series across the power source. When timer switch 34 is closed, timer 32 is activated; and it energizes time relay 36 for an interval of time that is determined by the setting of timer 32. Timer relay 36 closes timer relay switch 38; and thus energizes a device such as an adjustable auto-transformer 40. The output of auto-transformer 40 is applied to a suitable transformer 42 that produces the desired output voltage. A voltmeter switch 44 and a voltmeter 46 are connected across the output of transformer 42 to monitor the output voltage that will eventually be applied to the split electrode.

The control circuit of FIGURE 2 contains another useful feature, namely a continuity tester.

It is desirable to be sure that the split electrode is pressed firmly against the lead wire which is to be bonded; and, in order to be sure of this, a continuity test current is sent through the split electrode. As shown in FIGURE 2, when continuity switch 48 is closed, the continuity power supply 50 activates continuity relay 52, which moves the two ganged switchblades 51 upwards. When the switchblades 51 are in their upper position, current flows from battery 54 through adjusting resistance 56, through ammeter 58, through the upwardly-positioned upper switchblade 51A, through electrode wire 24A, down one portion 12A of the split electrode, through the lead wire 22, up through the other portion 12B of the electrode, through the other electrode wire 24B, through the upwardly-positioned switchblade 51B, and thus returns to battery 54.

If the split electrode is not in firm contact with the lead wire 22, the ammeter 58 will indicate that no current is flowing. This lack of continuity indicates that the apparatus is not in condition for bonding. The split electrode 10 is then lowered further, until a second continuity test indicates the flow of an appreciable current. At this time, continuity switch 48 is opened, the switchblades 51 revert to their lower position, and the timer switch 34 may be closed to produce a diffusion bond.

A satisfactory continuity test indicates that the working end of the electrode is in good electrical contact with the lead wire, and thus assures that there will not be any electrical arcing when the switch is closed to form the diffusion bond.

The diffusion bonding operation is a follows. Closing timer switch 34 causes timer 32 to energize the timer relay 36 for a given interval of time, during which current from power source 30 is transformed by transformers 40 and 42, and is directed by the downwardly positioned switchblades through electrode wires 24 to the outer portions of the split electrode 10. As previously explained, the current passes through the lead wire 22, and thus produces localized heat that produces a diffusion bond.

Lap joints of the type described above are widely used in industry, and have been quite satisfactory. There are, however, two principal objections, namely (1) the approach angle of the lead wire, and (2) the limitation on the direction in which the lead wire 22 may be bent.

For example, it may be understood from FIGURE 1 that it is frequently necessary to move the lead wire up or down, and to one side or the other in order that it may reach components or portions of the printed wire pattern. This movement sets up an undesirable strain in the joint.

In order to overcome this objection to lap joints, another type known as a "nail-head" joint is used.

In this case, the lead wire had a spherical ball at its end. In bonding this type of nail-head lead wire, the wire projects upward; and the lower apex of the sphere is pressed against a printed wire pattern to which it is to be bonded. Under the influence of the pressure and heat, the releatively-soft spherical nail-head deforms into a relatively flat shape similar to the nail-head of the usual nail.

In a diffusion bonded nail head joint the lead wire may be moved backward and forward, or from right to left with equal facility; and the lead wire may thus be directed in any direction in order to reach the particular component or printed wire pattern to which it is to be connected.

Figure 3:
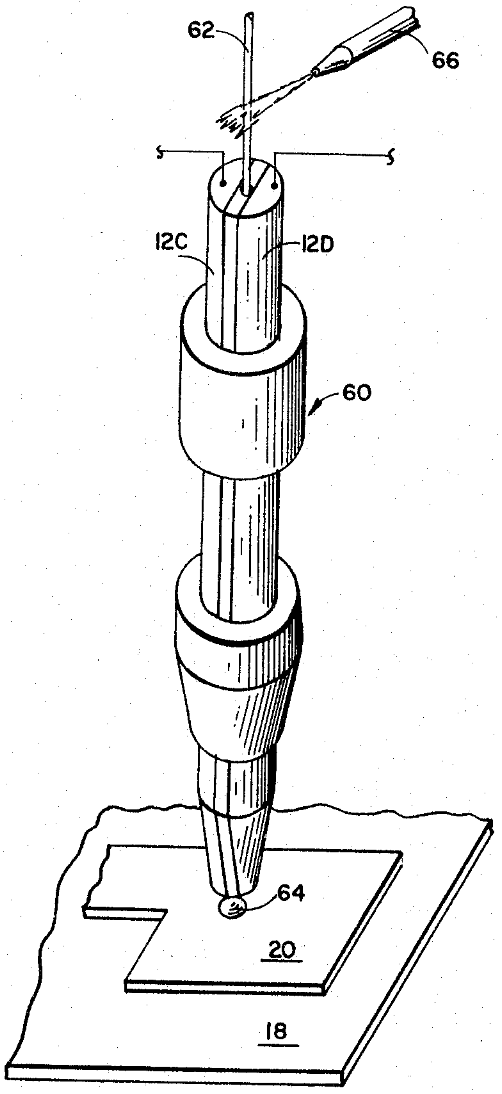

The apparatus and method for achieving a nail-head diffusion bond is shown in FIGURE 3.

It will be seen that split-electrode 60 of FIGURE 3 is quite similar to the one previously described; comprising two semi-cylindrical outer portions 12C and 12D that are separated and isolated from each other by coatings of a suitable material. The adjacent coatings form an axial hole throughout the split electrode's entire length, the inside of the hole being insulated from the outer metallic portions.

In a manner to be described later, a lead wire 62 is fed downward through the axial hole, and terminates in a spherical ball 64 that is pressed by the working end of split electrode 60 against the printed wire pattern 20.

In operation, the electric current is applied by the control circuit as previously described, and travels down one outer portion 12 of the split electrode, through the spherical ball 64, and back through the other outer portion 12. Since the curent passes through the spherical ball 64, the ball therefore becomes warm, but does not melt; and the diffusion area between the spherical ball and the printed wire pattern 20 is raised to the diffusion temperature for the desired interval of time. The diffusion area is thus warmed to the extent necessary to permit the occurrence of a diffusion bond.

During the diffusion bonding process, the spherical ball is gradually flattened out until it takes the shape of a nail-head, the wire 62 acting as the shank of the nail.

It should be noted that there is no melting; and that the nail-head does not tend to float away, since the working end of the split electrode causes the elements being diffusion-bonded to remain in close proximity. Also, there is no necking-down of the lead wire.

At the end of the diffusion process, the electrode 60 is raised. The diffusion-bonded nail-head 64 remains attached to the printed-wire pattern 20, and the split-electrode 60 slides upward until its tip is above the level of torch 66. The torch is energized, or positioned, to burn through the lead wire 62; leaving the nail-head lead wire with its head firmly bonded to printed wire pattern 22.

The burning action of torch 66 melts a volume of the wire at the burned-through end of lead wire 62; and upon cooling, the molten portion assumes a spherical shape that may have a diameter of .002 of an inch, while the lead wire itself may have a diameter of .0005 of an inch. As the electrode 60 is brought downwards, its tip engages the newly-formed spherical ball, and carries this ball downward; thus unreeling an additional length of lead wire from a suitably-positioned spool.

In this way, the apparatus is ready to form another nail-head diffusion bond with another portion of the printed wire pattern.

It is of course desirable that the printed wire pattern, or the electrode, be positionable by a device such as a micromanipulator; and that the positioning be observable through an optical system such as a magnifying glass or a microscope.

It may thus be seen that the apparatus of FIGURE 3 produces a nail-head diffusion bond wherein the lead wire has its head securely bonded to the printed wire pattern, and—since the shank of the nail-head lead wire extends upwards—it may be bent forwards or backwards or from side to side in order to reach any given component or portion of the printed wire.

In the previous discussion it was indicated that the spherical ball carried the current required for heating it, and became slightly deformed due to the pressure and heating effect. At times this may be a disadvantage. For example, in the split electrodes disclosed thus far, the central portion comprises an insulator that is softer than the metallic outer portions, and in addition remains relatively cool. Therefore, a slightly greater deformation is produced by the metallic ends of the split electrode, as compared with the insulated center portion.

In cross section, the overall appearance of the upper surface of the bonded nail head would be something like a mountain projecting from a plane. Under some conditions the change in thickness causes a mechanical stress which may be undesirable, as it may cause breakage under movement or vibration.

In order to overcome this difficulty, the split electrode 68 of FIGURE 4 may be used.

Figures 4A, 4B, 5, 6, 7:
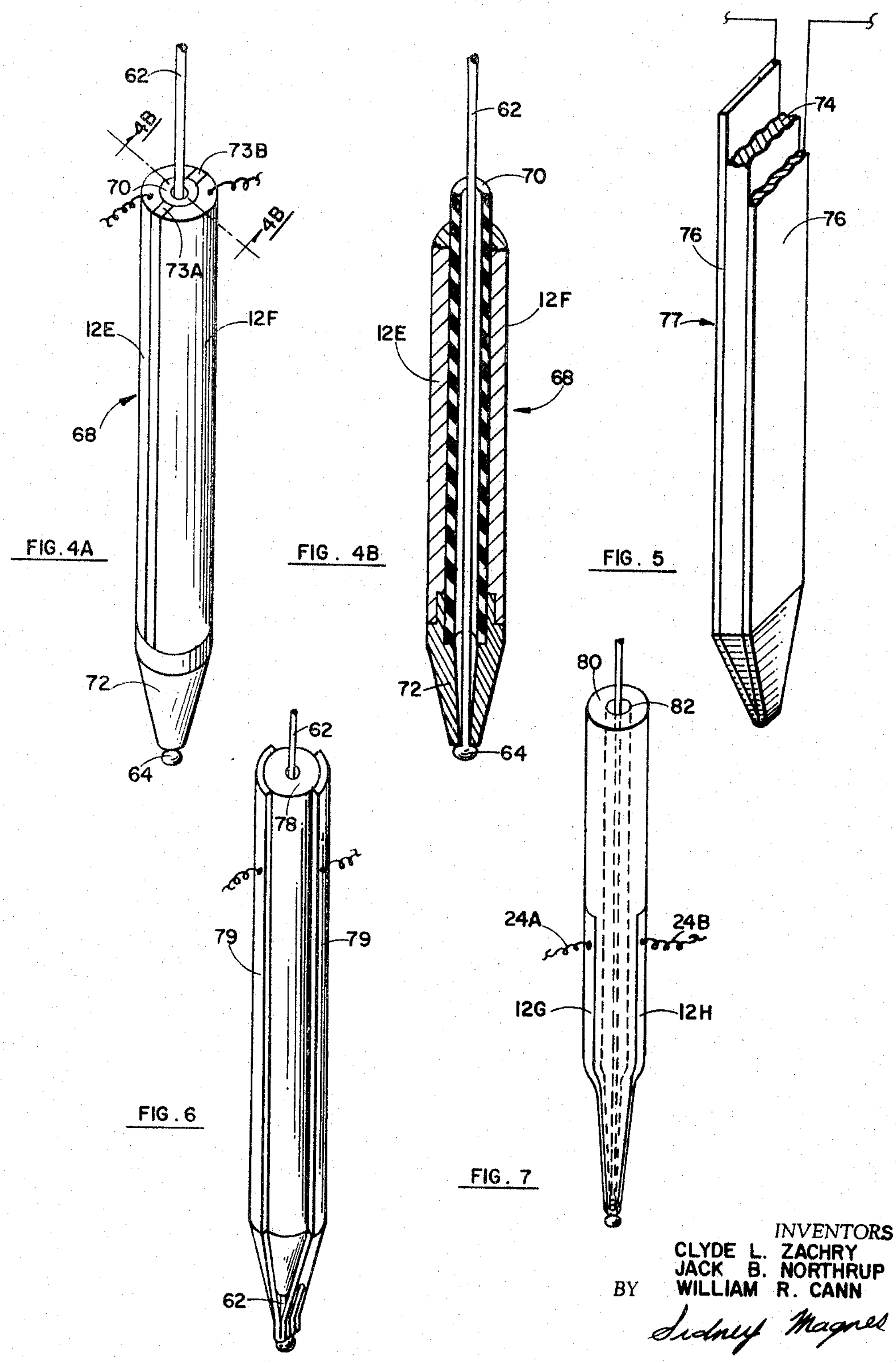

Basically, the split electrode of FIGURE 4A comprises semi-tubular electrically-conductive outer portions 12E and 12F, having flat surfaces and concave surfaces. An insulating tube 70 of suitable material, such as Teflon, fits into the concave surfaces to receive the lead wire 62; and insulating sheets 73 fit between the flat surfaces to complete the assembly. If desired, the assembly may be cemented together, or may use the previously-described collars.

The working end of electrode 68 is shown in the cross sectional view of FIGURE 4B, and comprises a ring 72 of suitable high-electrical-resistance material such as tungsten or Nichrome; these materials having the advantage that they will not stick to, or combine with, the materials being bonded. Ring 72 is shaped in such a way that it completes the electrical circuit between the two outer portions 12 of the split electrode, and has an aperture to receive the lead wire 62.

In using the split electrode of FIGURE 4, electricity is applied to the two outer portions 12 by a control circuit such as that previously described. The electricity flows down one outer portion of the split electrode, through the high resistance ring 72, and back through the other outer portion of the split electrode. Since the outer portions 12 are of low electrical conductivity, and the resistive ring 72 is of high resistivity, the resistive ring develops heat from the passage of the electric current. As a result it becomes warm, and warms up the spherical ball, the heat being transmitted to the printed wire pattern. In this way the diffusion bonding takes place as previously described, and the resistive ring 72 applies uniform pressure over the entire surface of the spherical ball 64. Due to the presence of the heat and the pressure, the entire spherical ball is deformed into a uniform nail-head that does not have any protuberances or hollows to weaken it and introduce the possibility of breakage.

The structure of FIGURE 4 is relatively easy to manufacture, since it uses a commercially available Teflon tube 70, split tubing 12, sheets 73, and a tungsten ring 72 that may be formed in a lathe. Since tungsten itself is rather difficult to machine, it is preferable to form ring 72 from a material which contains suitable proportions of tungsten, copper, and nickel; this combination of materials providing the desired high electrical resistance, and yet producing an alloy that may be machined to the desired shape and size. An example of such a material is "Mallory 1000," produced by the P. R. Mallory Company, Indianapolis, Ind.; "Mallory 1000" contains by weight 90% tungsten, 4% copper, and 6% nickel.

FIGURE 5 shows another structure for a diffusion bonding electrode. This one is designed for lap welding, and outer portions 76 comprise a continuous strip of resistive material such as Nichrome, formed into a modified-V configuration, wherein the sides of the V are extended parallel to each other. At the working end of electrode 77, the strip of resistive material 76 is folded back in a re-entrant manner, to form a thin edge portion that may press upon the lead wire to be bonded. This is preferably necked-down to improve visibility, and to concentrate the heating effect. The center portion 74 comprises a block of insulating material, such as aluminum oxide formed into a corresponding modified-V configuration.

In operation, current from a control circuit flows through the resistive continuous strip of material 76, which thereupon becomes warm. The working end becomes warm enough to raise the lead wire, the printed-wire pattern, and the diffusion area to the diffusion temperature. This particular electrode is very easy to manufacture, and is very satisfactory.

FIGURE 6 shows another arrangement modified-V configuration, using a continuous strip of resistive material such as Nichrome. In FIGURE 6 the central insulative portion 78 may comprise a tube of material such as aluminum oxide, this tube having a longitudinal hole for receiving the lead wire 62. In this arrangement the strip 79 of resistive material is curved to fit the periphery of the central insulating portion 78; and is folded at the working end in the manner previously described. The width of the resistive material 79 is preferably decreased at the working end so that the heat is concentrated at a smaller area; the overall configuration resembles a pencil.

Since the electrode may be designed for a nail-head lead wire, the folded portion at the working end of the electrode may be suitably notched, as shown in FIGURE 6, to provide room for the lead wire 62.

It should be noted that the split electrode of FIGURE 5 may also be pierced and notched for a nail-head lead wire.

FIGURE 7 shows another split electrode for achieving a diffusion bond. This comprises a tube 80 of ceramic material such as glass, and has an axial hole 82 therethrough. For improved visibility at the bonding area, tube 80 is necked down by a process such as pulling.

The surface of the tube 80 has deposited thereon two separate insulated layers 12G and 12H of conductive material; these layers of conductive materials being somewhat smaller than half the periphery of the tube in order to form separate, insulated conductive portions; which are then connected to a control circuit such as previously described. The conductive surfaces extend to the working end of the electrode, where they contact the spherical ball.

The lead wire 62 is fed through the axial hole as previously described, and a spherical ball produced at its lower end.

In operation, the tube behaves in the same manner as the previously described split electrodes, the electric current being carried by the layers of conductive material and the spherical ball of the nail-head lead wire.

Figures 8, 9, 10:
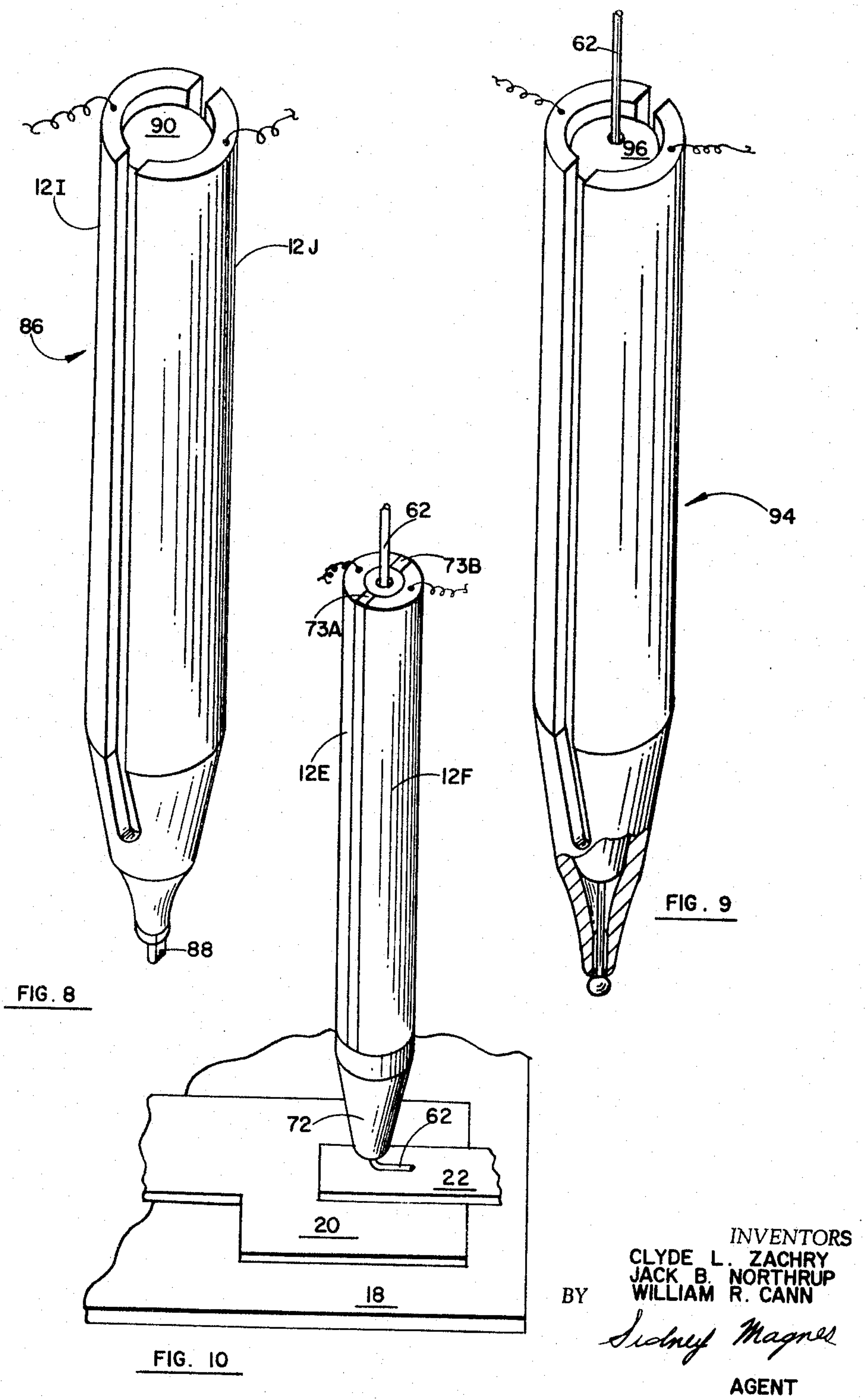

FIGURE 8 shows another split electrode, 86, formed by molding tungsten. As in the previous split electrodes, the electric current flows down one outer portion 12, through the cone-like working end, and back through the other outer portion 12. Thus the working end becomes warm, and tang 88 warms the diffusion-bonding area to the diffusion temperature. An insulating rod 90 may be used for additional strength, and to assure isolation between the outer portions.

FIGURE 9 shows still another split electrode, 94, also formed of molded tungsten, and designed for use with a nail-head lead wire. Its cone-like working end is pierced for receiving the wire portion of a nail-head lead wire; the working end being shaped to apply uniform pressure to the ball of the nail-head lead wire. If desired, an insulating tube may be used to provide additional strength, to assure isolation, and to guide the lead wire through the electrode.

FIGURE 10 shows a way of using a split electrode for a lap bond, should this be desirable. Here the lead wire 62 is fed through the split electrode as previously described; but, instead of having a spherical ball at its end, it is positioned flat against the surface to which it is to be bonded.

This arrangement permits the lead wire to be conveniently unreeled from a suitable spool; and the portion to be bonded can be bent in a suitable direction so that the unbonded portion of the lead wire automatically points in the desired direction.

The localized heating is provided as previously described.

*Advantages*

The present application has disclosed improved means and apparatus for producing diffusion bonds. First, it produces localized heating, of only the desired temperature and duration; thus obviating the disadvantages of prior-art overall heating techniques. Second, both lap and nail-head joints can be made. Third, the disclosed device maintains the pressure, so that the bonded elements do not separate. And, finally, the disclosed electrodes may be selected for type of bond, size of wire, economy or ease of fabrication, or simplicity of repair.

Although the invention has been illustrated and described in detail, it is to be clearly understood that the same is by way of illustration and example only and is not to be taken by way of limitation, the spirit and scope of this invention being limited only by the terms of the appended claims.

We claim:

1. An apparatus for diffusion bonding a wire to a workpiece comprising
a first electrically-conductive outer portion;
a second electrically-conductive outer portion;
means for assembling said two portions into a unitary split electrode structure that permits electricity to flow down one said outer portion and back through the other said outer portion;
means whereby a wire may be fed into the top of said split electrode and emerge from the bottom of said split electrode and means for enlarging a portion of said emergent wire, and wherein said electrode structure is adapted to transmit pressure to said enlarged portion.

2. A diffusion bonding device comprising
a first electrically conductive outer portion;
a second electrically conductive outer portion;
an insulative central portion having a longitudinal hole through the length thereof;
said three portions being assembled into a unitary split electrode structure adapted to transmit pressure, and means to permit sufficient electricity to flow down one said outer portion and back through the other said outer portion for heating an article to its diffusion bonding temperature.

3. A diffusion bonding apparatus comprising:
a first semi-tubular electrically-conductive outer portion, having a concave surface;
a second semi-tubular electrically conductive outer portion having a concave surface, means for assembling said two portions into a unitary split electrode structure that permits electricity to flow down one outer portion and back through the other said outer portion; and means whereby a wire may be fed into the top of said split electrode and emerge from the bottom of said split electrode, said wire feed means comprising
an insulative tube positioned between said concave surfaces of said semi-tubular portions said insulative tube comprising a fluorinated plastic.

4. An apparatus as defined by claim 1 wherein said means for assembling includes
high electrical-resistance means for electrically connecting the ends of said electrically-conductive outer portions.

5. A diffusion bonding apparatus comprising,
a unitary split electrode having a longitudinal opening through the length thereof, and
means whereby a wire may be fed into the top of said opening to extend from the bottom thereof, said means comprising an insulative portion disposed between portions of said split electrode, said insulative portion having a longitudinal hole through the length thereof, and
wherein said electrode is adapted to transmit pressure.

6. An apparatus for diffusion bonding a wire to a workpiece comprising, in combination:
a unitary split electrode having a longitudinal opening through the length thereof, said electrode being adapted to transmit pressure, means whereby a wire may be fed into the top of said opening to emerge from the bottom thereof, and means, comprising an electrically resistive ring, for heating the emergent area of said wire to a temperature sufficient to achieve diffusion bonding but below the melting temperature of said wire.

7. An apparatus as defined in claim 1 wherein said means for assembling comprises a ring of high-electrical resistance material selected from the class consisting of tungsten and Nichrome.

8. An apparatus as defined by claim 1 further comprising means for providing sufficient electrical voltage between said first and second electrically-conductive outer portions for heating said enlarged portion to its diffusion temperature.

9. An apparatus as defined in claim 8 wherein said means for providing comprises timer means for disconnecting said voltage after a predetermined period of time.

10. A device as defined in claim 2 wherein said insulative portion comprises a fluorinated plastic and wherein the inside diameter of said hole is on the order of .001 inch.

References Cited by the Examiner

UNITED STATES PATENTS

| | | | |
|---|---|---|---|
| 236,972 | 1/1881 | Ball | 219—233 X |
| 1,899,220 | 2/1933 | Wappler | 219—233 |
| 2,033,897 | 3/1936 | Jenkins et al. | 219—233 |
| 2,101,913 | 12/1937 | Meyer | 219—233 |
| 2,692,935 | 10/1954 | Pearce et al. | 219—234 X |
| 2,789,198 | 4/1957 | Dye et al. | 219—234 X |
| 2,829,240 | 4/1958 | Ballington | 219—136 |
| 2,958,758 | 11/1960 | Snell | 219—152 |
| 3,097,286 | 7/1963 | Luke | 219—235 X |

FOREIGN PATENTS

| | | |
|---|---|---|
| 787,065 | 6/1935 | France. |

RICHARD M. WOOD, *Primary Examiner.*

B. A. STEIN, *Assistant Examiner.*